United States Patent
Beaulieu

(10) Patent No.: US 6,489,852 B1
(45) Date of Patent: Dec. 3, 2002

(54) SLEW CONTROLLED FRAME ALIGNER FOR A PHASE LOCKED LOOP

(75) Inventor: Rejean Beaulieu, Mercier (CA)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/620,404

(22) Filed: Jul. 20, 2000

(51) Int. Cl.[7] ................................. H63L 7/00
(52) U.S. Cl. .................. 331/25; 331/1 A; 331/16; 375/376; 327/156
(58) Field of Search ...................... 331/25, 2, 14, 331/16, 1 A; 375/371, 373, 376; 327/156, 159

(56) References Cited

U.S. PATENT DOCUMENTS 5,254,955 A   10/1993  Saeki et al. ............... 331/17
5,726,607 A  * 3/1998  Brede et al.
6,084,479 A  * 7/2000  Duffy et al. .............. 331/17

* cited by examiner

Primary Examiner—Arnold Kinkead
(74) Attorney, Agent, or Firm—Jones, Day, Reavis & Pogue

(57) ABSTRACT

A phase locked loop (PLL) is provided for synchronizing a PLL output signal to a plurality of reference clock signals and for aligning the PLL output signal with a distributed frame signal. The PLL includes a slew controlled frame aligner for controlling the phase deviation in the feedback signal of the PLL to thereby control the phase deviation of the PLL output so as to meet a particular phase deviation timing requirement. The slew controlled frame aligner includes a ramp generator for generating a plurality of digital add and skip pulses that are coupled to the feedback counter in the PLL to thereby control the equivalent analog phase added to or subtracted from the feedback signal.

17 Claims, 4 Drawing Sheets

SLEW CONTROLLED FRAME ALIGNER FOR A PHASE LOCKED LOOP

BACKGROUND OF THE INVENTION

1. Technical Field

The present invention is directed to the field of phase locked loops. More specifically, the invention provides an improved phase locked loop ("PLL") having a slew controlled frame aligner for adjusting the feedback signal of the PLL in order to control the alignment of the PLL output with an external frame signal.

2. Description of the Related Art

Phase locked loops are well-known elements in analog and digital circuit design. A phase locked loop operates by receiving an input reference clock signal and generating a localized oscillator signal that is synchronized with the reference clock signal. The local oscillator signal that is output from the PLL may operate at the same frequency as the reference clock signal or at some integer multiple of that frequency. A general description of the theory and operational characteristics of a PLL is contained in Couch, *Digital and Analog Communication Systems*, Fourth Edition, pp. 289–296.

FIG. 1 is a circuit diagram of a known PLL circuit 10A. This circuit 10A includes four primary elements—a phase detector 14, an integrator 16, a voltage controlled oscillator (VCXO) 18, and a counter 26. This circuit 10A generates a local oscillator signal (PLL clock) 34 that is synchronized with an input reference clock signal 12, but which operates at a higher frequency than the reference clock 12. This is accomplished by feeding back a divided down version 38 of the local oscillator signal 34 to the phase detector 14, which then compares the phases of the reference clock signal 12 with the feedback signal 38.

The phase detector 14 compares the phases of the signals at its two inputs, and generates output pulse signals having pulse widths that correspond to the phase difference between the two input signals. These output pulse signals are then coupled to the integrator 16. The integrator 16 receives the pulses from the phase detector outputs and generates a voltage level at its output that is proportional to the pulse width of the phase pulses. This phase voltage is then provided as an input to the voltage controlled oscillator (VCXO) 32.

The voltage controlled oscillator 32 generates an output clock signal, PLL clock 34, which is characterized by a frequency that is proportional to the phase voltage from the integrator 16. This clock signal, PLL clock 34, is the localized oscillator signal that is synchronized with the reference clock 12. The PLL clock signal 34 is then fed back to one of the inputs of the phase detector 14 either directly, or via a counter 26.

The counter 26 is configured as a divide-by-N counter, and it generates the PLL feedback signal 38, which is a frequency divided version of the PLL clock signal 34. By selecting an appropriate value of N, a circuit designer can select the frequency of the PLL clock signal 34 with respect to the external reference clock 12. For example, if the circuit designer desires to generate a synchronized version of the reference clock signal 12, but at a frequency 10 times greater than the reference clock signal 12, then the value of N would be 10.

In distributed communication systems, such as SONET/SDH networks that include a plurality of network elements coupled via fiber optic connections, there is often a need to distribute more than one reference clock to the various network elements in order to ensure synchronization of these elements. Typically, a system may include a primary input reference clock (which is used in normal operation) and a backup input reference clock (which is used when the primary clock fails.) These reference clocks are typically not synchronized to each other, but exhibit independent phase and frequency characteristics.

A PLL circuit is typically used to carry out this synchronization step. The PLL preferably locks onto the primary input reference clock. If the primary reference clock fails, however, then the PLL must lock onto the backup reference signal. But because of the independent phase and frequency characteristics of the two reference signals, this switch over often results in the PLL gaining or losing several clock cycles in comparison to other PLLs in the network that are locked onto the same reference signal.

These types of communication systems also typically distribute a unique frame signal. The frame signal is generally at a much lower frequency than either of the reference clock signals, and it is used to ensure that all of the network elements are communicating data at a common frame boundary. Thus, when the PLL switches from one reference signal to another, it must resynchronize its output with the high-frequency reference clock signal and it also must realign the same output with the distributed frame signal. This realignment step is typically carried out by adding or subtracting clock pulses to the PLL feedback signal.

FIG. 2 is a circuit diagram of a known PLL 10B having an external frame phase detector and a single-step controller for adding or subtracting clock pulses into the PLL feedback signal. This circuit 10B is utilized to correct the frame alignment of the PLL output when the PLL switches from a primary reference clock signal to a backup reference clock signal in order to maintain alignment with an externally-provided, distributed frame signal.

In addition to the common elements of the PLL 10A shown in FIG. 1, namely the phase detector 14, the integrator 16, the voltage controlled oscillator 18, and the counter 26, the PLL 10B shown in FIG. 2 includes a switch 20, a divider 24, a frame phase detector 22, and a single-step controller 30. The switch 20 is coupled to the primary input reference clock 12A and the backup input reference clock 12B. During normal operation, the switch 20 is set to select the primary reference clock 12A. If, however, this clock 12A were to fail, for whatever reason, then the switch 20 is toggled to select the backup reference clock signal 12B. The output of the switch 20 is a reference clock that is provided to one input of the phase detector 14. Like the circuit shown in FIG. 1, the other input to the phase detector 14 is the PLL feedback signal 38.

The operation of the phase detector 14, the integrator 16 and the VCXO 18 is similar to that described above. In addition to providing the PLL output signal 34 (also referred to as the local oscillator signal) to the counter 26, the circuit shown in FIG. 2 also provides this signal 34 to the divider 24. The divider divides down the frequency of the local oscillator signal 34 to generate a local frame signal 42. The local frame signal 42 is generally characterized by a substantially lower frequency than the frequency of the local oscillator signal 34. This local frame signal 42 is then provided to one input of a frame phase detector 22.

The frame phase detector 22 is also coupled to an external distributed frame signal 40, and outputs a control signal 28 that corresponds to the phase difference between the local frame signal 42 and the distributed frame signal 40. This control signal 28 is then provided to the single step controller 30. The single step controller 30 examines the control signal in order to determine the amount of phase lead or lag between the local frame signal 42 and the distributed frame signal 40. Based on this determination, the single-step controller 30 then attempts to realign the two frame signals by either adding or subtracting a single clock count from the PLL feedback signal 38. This is done by sending an "add" signal 32 or a "skip" signal 36 to the counter 26.

When an entire clock count is added or subtracted in this manner, however, the phase detector will suddenly determine that the PLL feedback signal 38 is out of phase with the reference clock (by one clock count), and the PLL will force the VCXO to increase or decrease in frequency in order to re-lock to eliminate this phase difference.

The problem with this sudden reaction by the PLL is that in certain telecommunication systems, such as the SONET/SDH systems noted above, there is a requirement that limits the reaction speed of such a PLL circuit under these conditions. One reason for this reaction speed requirement is that in such systems one PLL circuit may be feeding other PLL circuits in other parts of the system, which may in turn be feeding still other PLL circuits, and if one of the PLLs in the chain reacts too quickly, then the phase variation in the output signal may cause other PLLs in the chain to become unlocked.

A typical solution to this problem is to slow down the loop bandwidth of the PLL so that in reaction to the single-step add or skip command from the single-step controller 30, the loop does not violate the reaction speed requirement. This solution, however, degrades the locking ability of the PLL under certain conditions, such as under temperature variations, and therefore is not desirable.

SUMMARY OF THE INVENTION

A phase locked loop (PLL) is provided for synchronizing a PLL output signal to a plurality of reference clock signals and for aligning the PLL output signal with a distributed frame signal. The PLL includes a slew controlled frame aligner for controlling the phase deviation in the feedback signal of the PLL to thereby control the phase deviation of the PLL output signal so as to meet a particular phase deviation timing requirement. The slew controlled frame aligner includes a ramp generator for generating a plurality of digital add and skip pulses that are coupled to the feedback counter in the PLL to thereby control the equivalent analog phase added to or subtracted from the feedback signal.

According to one aspect of the invention, a phased lock loop (PLL) circuit for locking onto either a primary input reference clock signal or a backup input reference clock signal is provided. The circuit includes: (1) a switch for selecting a reference signal from one of the primary input reference clock signal or the backup input reference clock signal; (2) a phase detector coupled to the reference signal and a feedback signal for discriminating the phase difference between the reference signal and the feedback signal and for generating a corresponding phase pulse output; (3) an integrator coupled to the phase pulse output for generating a phase voltage; (4) a voltage controlled oscillator coupled to the phase voltage for generating a local oscillator signal that is synchronized to the reference clock signal; (5) a feedback circuit including a counter coupled to the local oscillator signal for generating the feedback signal; and (6) a slew controlled frame aligner coupled to the local oscillator signal and the counter for controlling the slew rate of the phase deviation in the feedback signal.

Another aspect of the invention provides a phase locked loop for generating a synchronized output signal in response to a reference clock signal and a feedback signal, the phased lock loop comprising a slew controlled frame aligner for aligning the synchronized output signal with an external frame signal, wherein the slew controlled frame aligner controls the slew rate of the phase deviation in the feedback signal in response to a phase deviation between the synchronized output signal and the external frame signal.

Still another aspect of the invention provides a phase locked loop, comprising: (1) a switch for selecting a primary reference clock signal or a backup reference clock signal and for outputting a selected reference clock; (2) a synchronization loop comprising a phase detector, a voltage controlled oscillator coupled to the phase detector for generating an output clock signal, and a feedback counter coupled between the voltage controlled oscillator and the phase detector, wherein the phase detector is coupled to the selected reference clock and a feedback signal output from the feedback counter; and (3) a slew controlled frame aligner coupled to the feedback counter for altering the phase deviation in the feedback signal over a predetermined time period in order to align the output clock signal with a distributed frame signal in response toggling the switch.

Yet another aspect of the invention provides an improved phase locked loop having a phase detector coupled to a reference clock signal and a feedback signal, a voltage controlled no oscillator coupled to the phase detector for generating a synchronized output signal, and a feedback counter coupled to the synchronized output signal for generating the feedback signal. The improvement includes a slew controlled frame aligner for controlling the phase deviation of the feedback signal in response to a sensed phase deviation between the synchronized output signal and a distributed frame signal.

Still another aspect of the invention provides a method of aligning a PLL output signal with a distributed frame signal. The method includes the following steps: (a) dividing down the frequency of the PLL output signal to generate a local frame signal; (b) detecting the phase deviation between the local frame signal and the distributed frame signal and generating a control signal that corresponds to the detected phase deviation; (c) generating a plurality of digital pulse signals in response to the control signal; (d) coupling the plurality of digital pulse signals to a feedback counter in the PLL; and (e) aligning the PLL output signal with the distributed frame signal by adjusting the phase deviation of a feedback signal in the PLL to thereby adjust the phase of the PLL output signal.

It should be noted that these are just some of the many aspects of the present invention. Other aspects not specified will become apparent upon reading the detailed description of the drawings set forth below.

DETAILED DESCRIPTION OF THE DRAWINGS

Figure 1:
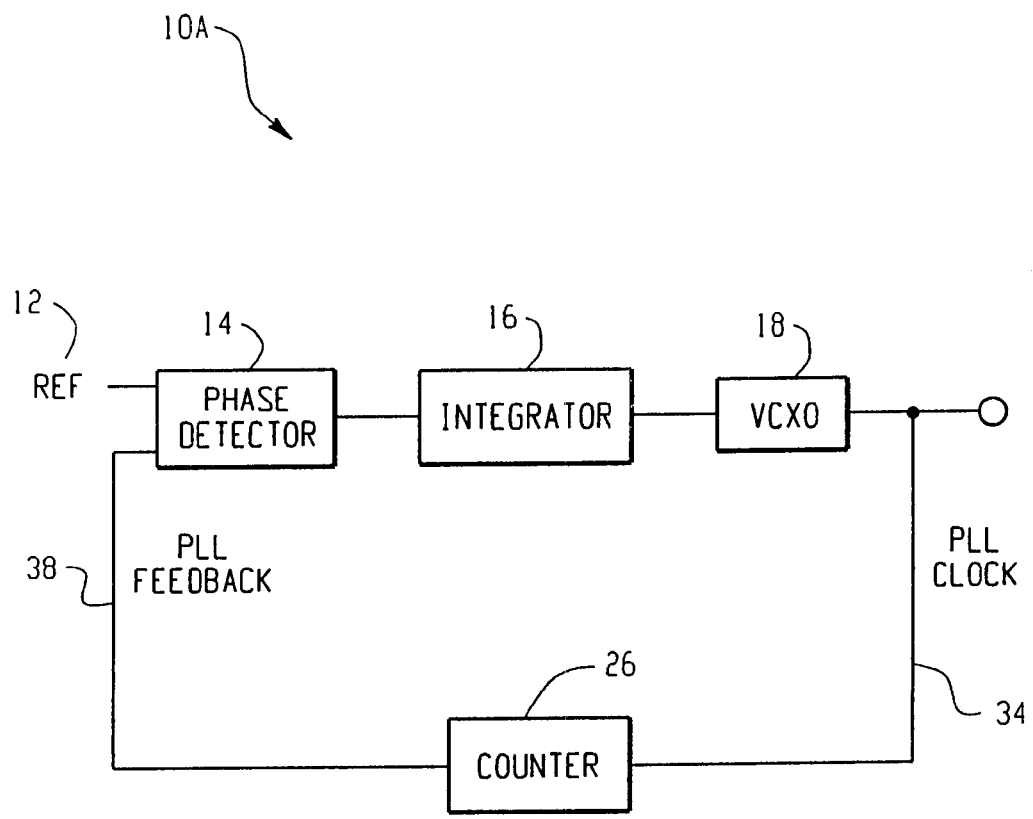
FIG. 1 is a circuit diagram of a known PLL.
Figure 2:
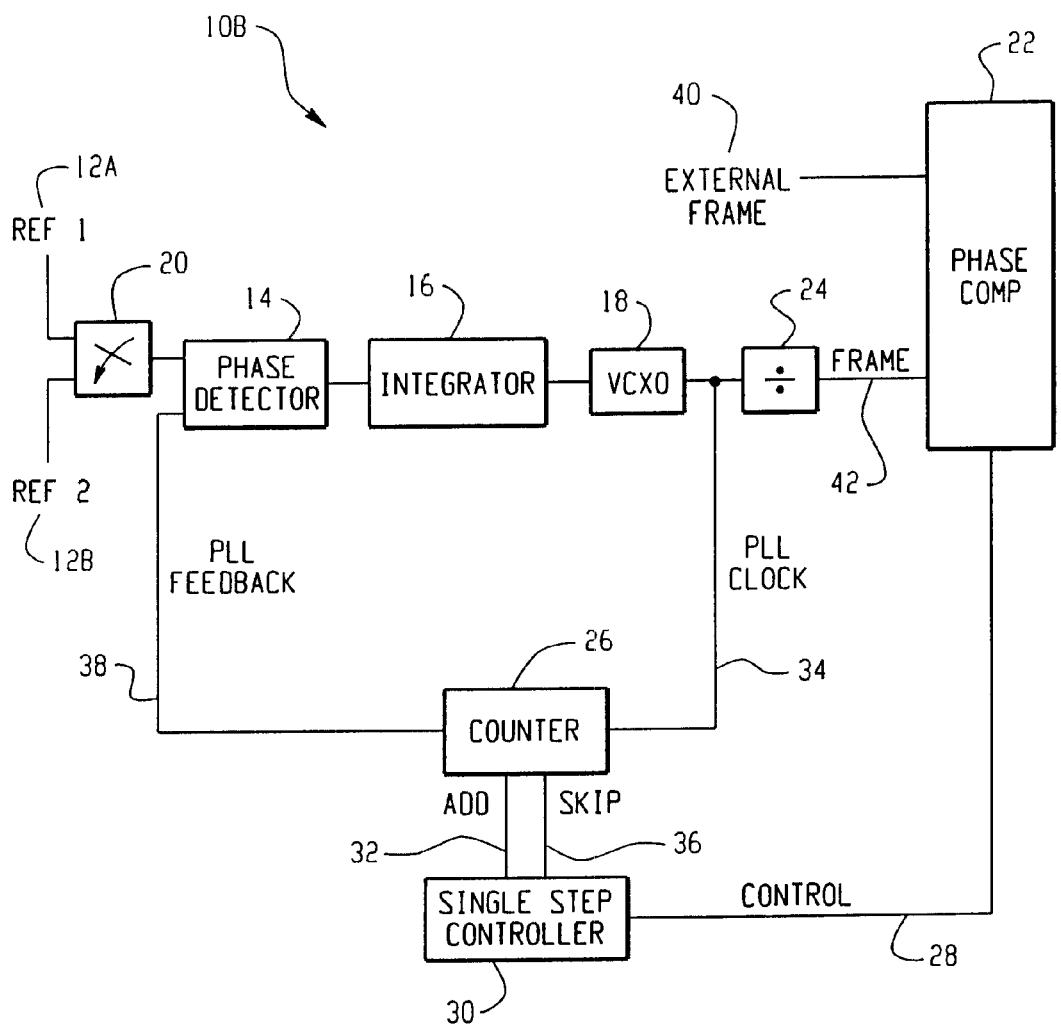
FIG. 2 is a circuit diagram of a known PLL having an external frame phase detector and a single-step controller for adding or subtracting clock pulses into the PLL feedback signal.
Figure 3:
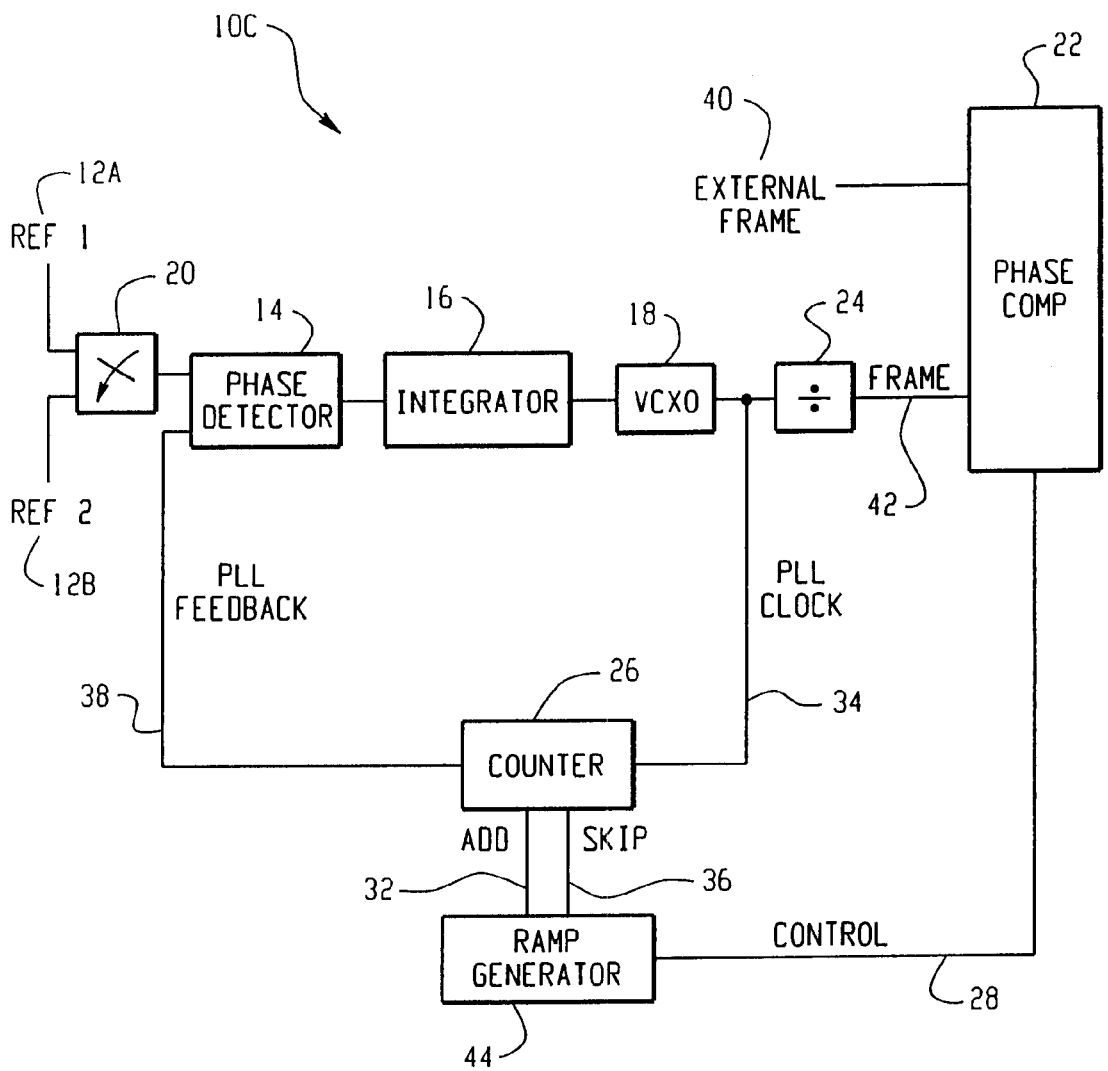
FIG. 3 is a circuit diagram of a PLL according to the present invention including a slew controlled frame aligner.

Turning now to the remaining drawing figures, FIG. 3 is a circuit diagram of a PLL 10C according to the present invention including a slew controlled frame aligner 44. Similar to the PLL 10B shown in FIG. 2, this circuit 10C includes a switch 20, a phase detector 14, an integrator 16, a voltage controlled oscillator 18, a feedback counter 26, a divider 24, and a frame phase detector 22. Unlike the circuit shown in FIG. 2, however, this circuit 10C includes a special slew controlled frame aligner 44 coupled between the frame phase detector 22 and the feedback counter 26.

The slew controlled frame aligner 44 is preferably a ramp generator. This circuit 44 receives a control signal 28 from the frame phase detector 22 and generates a series of add and skip pulses on the add and skip control lines 32, 36, coupled to the feedback counter 26. Unlike the circuit shown in FIG. 2, the PLL 10C according to the present invention does not add or subtract an entire clock pulse to the PLL feedback signal 38 in a single-step fashion, thereby abruptly altering the phase deviation of the feedback signal 38. Instead, the ramp generator 44 slowly slews the phase change of the feedback signal 38 by adding and subtracting multiple clock pulses to the feedback signal 38 over a set period of time in order to slowly converge the phase deviation to the equivalent of that caused by adding or subtracting a clock pulse in a single-step fashion.

The ramp generator 44 is preferably a digital controller that generates a digital train of pulses that are applied to the add and skip control signals 32, 36, in a similar fashion to a pulse-width modulator (PWM), thereby generating an equivalent analog transfer function that could represent a ramp or any other function. In this manner, the slew control of the feedback signal 38 phase deviation is digitally-controlled for improved linearity and time accuracy. Using this digital controller 44, the set period of time over which the realignment may be performed can be easily set to any period consistent with the performance requirements of the PLL, and any applicable phase deviation requirements of the system in which the PLL is operating.

Figure 4:
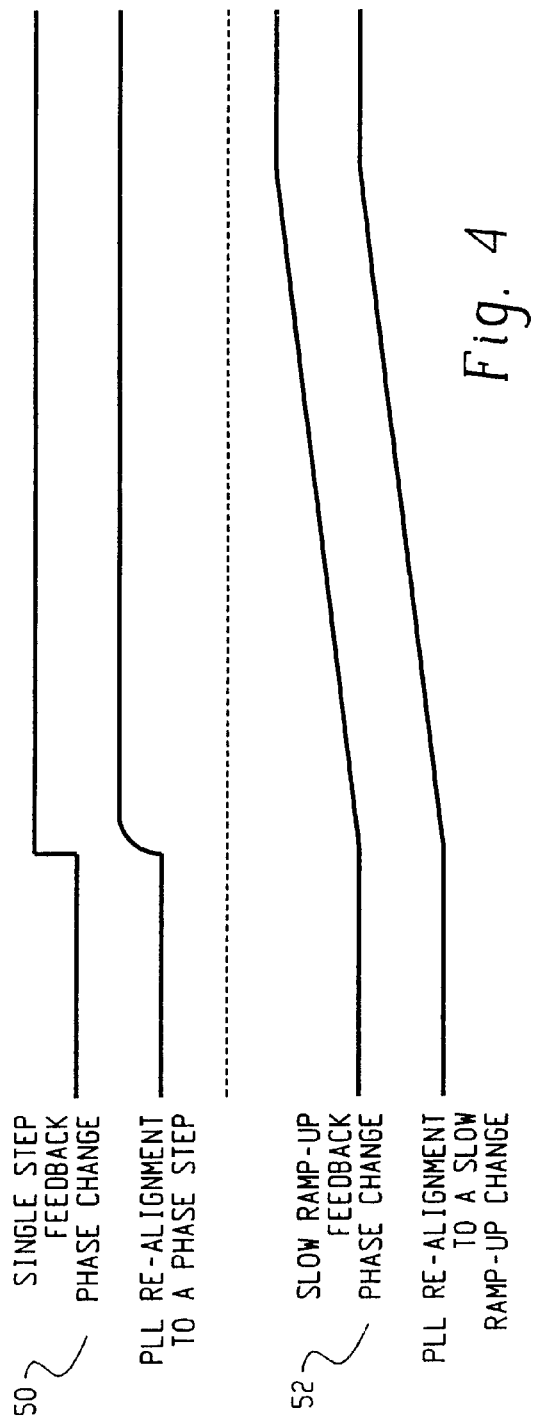
FIG. 4 is a timing diagram comparing the phase change and PLL realignment of the circuits shown in FIGS. 2 and 3.

FIG. 4 is a timing diagram comparing the phase change and PLL realignment of the circuits shown in FIGS. 2 and 3. The two upper traces 50 show the single-step feedback phase change and the corresponding PLL re-alignment response to the single-step phase change. These traces 50 are associated with the circuit shown in FIG. 2. The two bottom traces 52 show the slew controlled slow ramp-up of the feedback phase change and the corresponding PLL realignment to the slew controlled phase change. These two traces 52 are associated with the circuit shown in FIG. 3.

This figure shows the difference in the phase deviation timing of the PLL in response to a single-step phase change 50 and a slew controlled phase change 52. In the upper trace 50, it can be seen that the phase of the PLL output changes (or deviates) quickly in response to the single-step phase change in the feedback signal 38. It is this fast response, and corresponding abrupt phase deviation over a short period of time, which typically runs afoul of the applicable phase deviation timing requirement. In the lower trace 52, however, it can be seen that the phase of the PLL output changes slowly over a longer period of time in response to the slow, slew controlled, phase change of the PLL feedback signal 38. By controlling the phase deviation of the PLL output in this manner, the phase deviation timing requirement can be met without having to undesirably limit the locking speed of the loop.

Figure 5:
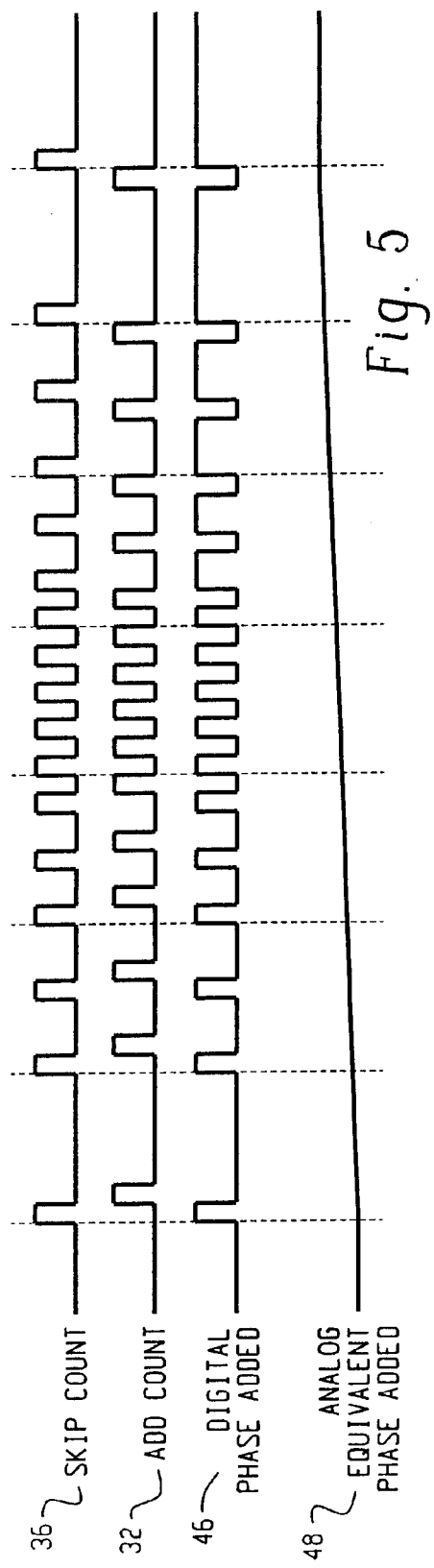
FIG. 5 is a timing diagram showing the operation of the slew controlled frame aligner set forth in FIG. 3.

FIG. 5 is a timing diagram showing the operation of the slew controlled frame aligner 44 set forth in FIG. 3. This figure includes four traces. The top two traces 32, 36 show the digital pulse signals from the ramp generator 44 on the skip count control line 36 and the add count control line 32 coupled to the counter 26. The bottom two traces 46 then show the digital phase added 46 to the feedback signal 38 and the corresponding analog phase added 48 to the same signal.

The operation of the slew controlled frame aligner 44 typically occurs over several time periods. The number of time periods, and the length of each period, may be determined by the circuit designer. By altering the number of time periods over which the aligner 44 operates, the circuit designer can effectively control the slew rate of the feedback signal 38 and hence the slew rate in the phase deviation of the PLL output 34.

FIG. 5 shows the slew controlled frame aligner 44 operating over eight time periods. Each time period is separated by a dashed line. In the first period, the aligner 44 outputs a single pulse on the skip line 36 followed almost immediately by a single pulse on the add line 32. This results in a minimum amount of analog phase being added to the feedback signal 38. In the second period, the aligner 44 outputs two pulses on the skip line 36, each of which is followed almost immediately by a corresponding pulse on the add line 32. This operation adds slightly more equivalent analog phase to the feedback signal 38 than was added in the first period, thus slowly slewing up the equivalent analog phase of the feedback signal 38. In similar fashion, in the third and fourth periods, the slew controlled frame aligner 44 adds three and then four pulses on each of the skip and add lines 32, 36, thus adding even more equivalent analog phase to the feedback signal 38.

In the fifth period, the aligner 44 again supplies three pulses on the skip line 36 and three pulses on the add line 32. Here, however, the add pulses are not output immediately after the skip pulses, but some time afterwards. This has the effect of adding even more equivalent analog phase change to the feedback signal. Similarly in the sixth and seventh periods, the slew controlled frame aligner outputs two and then just one pulse on each of the skip and add lines 36, 32, but with even more time difference between the skip and add pulses, thereby adding even more equivalent analog phase deviation to the feedback signal 38. Finally, in the last time period, the aligner 44 outputs a single pulse on the skip line 36.

By operating the frame aligner 44 as shown in FIG. 5, the slew rate of the feedback signal 38, and thus the PLL output 34, can be precisely controlled. In each time period leading up to the final period in which the aligner 44 outputs a single pulse on one of the add or skip lines, the aligner 44 outputs a plurality of add/skip pulses that result in an increasing amount of equivalent phase being added to the feedback signal 38. The amount of equivalent phase added in each period is programmable and may be set by the circuit designer to thereby create a particular transfer function for controlling the phase deviation of the PLL.

As noted above, this PLL circuit 10C may be advantageously employed in a digital telecommunications system in which multiple network nodes are coupled together and must synchronize to a common distributed frame signal. For example, this circuit 10C could be included in an add-drop multiplexer (ADM) network node within a SONET/SDH fiber optic network. In such a network, there may be a requirement limiting the phase deviation of the PLL, particularly where the PLL output is fed to one or more other PLLs, either in the same network node or in other nodes. By controlling the slew rate of the phase deviation in the feedback signal 38 of the PLL in a manner that is independent from the speed of the loop, this circuit 10C enables the PLL 10C to meet any phase deviation timing requirements without degrading the locking performance of the loop.

The preferred embodiment described with reference to the drawing figures is presented only to demonstrate an example of the invention. This detailed description is not meant to limit the invention in any way. Additional, and/or alternative, embodiments of the invention would be apparent to one of ordinary skill in the art upon reading this disclosure.

What is claimed:

1. A phased lock loop (PLL) circuit for locking onto either a primary input reference clock signal or a backup input reference clock signal, the PLL circuit comprising:
   a switch for selecting a reference signal from one of the primary input reference clock signal or the backup input reference clock signal;
   a phase detector coupled to the reference signal and a feedback signal for discriminating the phase difference between the reference signal and the feedback signal and for generating a corresponding phase pulse output;
   an integrator coupled to the phase pulse output for generating a phase voltage;
   a voltage controlled oscillator coupled to the phase voltage for generating a local oscillator signal that is synchronized to the reference clock signal;
   a feedback circuit including a counter coupled to the local oscillator signal for generating the feedback signal;
   a slew controlled frame aligner coupled to the local oscillator signal and the counter for controlling the slew rate of the phase deviation in the feedback signal; and
   a pair of control inputs coupled between the slew controlled frame aligner and the counter, wherein one of the control inputs is an add pulse input to the counter and the other control input is a subtract pulse input to the counter.

2. The PLL circuit of claim 1, wherein the slew controlled frame aligner outputs a plurality of pulses on the pair of control inputs to thereby control the phase deviation in the feedback signal.

3. The PLL circuit of claim 2, wherein the slew controlled frame aligner outputs the plurality of pulses over a plurality of time periods.

4. The PLL circuit of claim 3, wherein the slew controlled frame aligner adds an increasing amount of equivalent phase deviation to the feedback signal in each successive time period.

5. A phased lock loop (PLL) circuit integrated into a telecommunications network element for locking onto either a primary input reference clock signal or a backup input reference clock signal, the PLL circuit comprising:
   a switch for selecting a reference signal from one of the primary input reference clock signal or the backup input reference clock signal;
   a phase detector coupled to the reference signal and a feedback signal for discriminating the phase difference between the reference signal and the feedback signal and for generating a corresponding phase pulse output;
   an integrator coupled to the phase pulse output for generating a phase voltage;
   a voltage controlled oscillator coupled to the phase voltage for generating a local oscillator signal that is synchronized to the reference clock signal;
   a feedback circuit including a counter coupled to the local oscillator signal for generating the feedback signal; and
   a slew controlled frame aligner coupled to the local oscillator signal and the counter for controlling the slew rate of the phase deviation in the feedback signal.

6. The PLL circuit of claim 5, wherein the telecommunications network element is an add-drop multiplexer.

7. A phased lock loop (PLL) circuit for locking onto either a primary input reference clock signal or a backup input reference clock signal, the PLL circuit comprising:
   a switch for selecting a reference signal from one of the primary input reference clock signal or the backup input reference clock signal;
   a phase detector coupled to the reference signal and a feedback signal for discriminating the phase difference between the reference signal and the feedback signal and for generating a corresponding phase pulse output;
   an integrator coupled to the phase pulse output for generating a phase voltage;
   a voltage controlled oscillator coupled to the phase voltage for generating a local oscillator signal that is synchronized to the reference clock signal;
   a feedback circuit including a counter coupled to the local oscillator signal for generating the feedback signal; and
   a slew controlled frame aligner coupled to the local oscillator signal and the counter for controlling the slew rate of the phase deviation in the feedback signal, wherein the slew controlled frame aligner controls the slew rate of the phase deviation in the feedback signal according to a predetermined transfer function.

8. The PLL circuit of claim 7, wherein the predetermined transfer function is variable.

9. A phased lock loop (PLL) circuit for locking onto either a primary input reference clock signal or a backup input reference clock signal, the PLL circuit comprising:
   a switch for selecting a reference signal from one of the primary input reference clock signal or the backup input reference clock signal;
   a phase detector coupled to the reference signal and a feedback signal for discriminating the phase difference between the reference signal and the feedback signal and for generating a corresponding phase pulse output;
   an integrator coupled to the phase pulse output for generating a phase voltage;
   a voltage controlled oscillator coupled to the phase voltage for generating a local oscillator signal that is synchronized to the reference clock signal;
   a feedback circuit including a counter coupled to the local oscillator signal for generating the feedback signal; and
   a slew controlled frame aligner coupled to the local oscillator signal and the counter for controlling the slew rate of the phase deviation in the feedback signal, wherein the slew controlled frame aligner includes a ramp generator.

10. The PLL circuit of claim 9, wherein the ramp generator generates a plurality of digital pulse signals that are coupled to the feedback counter, and which control the operation of the feedback counter in order to add an increasing amount of analog phase deviation to the feedback signal over a set period of time.

11. The PLL circuit of claim 10, wherein the ramp generator is a digital controller.

12. The PLL circuit of claim 10, wherein the set period of time is variable.

13. A phase locked loop for generating a synchronized output signal in response to a reference clock signal and a feedback signal, the phased lock loop comprising:

a slew controlled frame aligner for aligning the synchronized output signal with an external frame signal, wherein the slew controlled frame aligner controls the slew rate of the phase deviation in the feedback signal in response to a phase deviation between the synchronized output signal and the external frame signal, and wherein the slew controlled frame aligner comprises:

a digital controller coupled to a control signal that represents the phase deviation between the synchronized output signal and the external frame signal; and a feedback counter coupled to the digital controller;

wherein the digital controller generates a plurality of digital pulse signals that are received by the feedback counter and which generate an equivalent phase deviation in the feedback signal, and wherein the digital pulse signals generated by the digital controller modulate the phase deviation in the feedback signal according to a predetermined transfer.

14. The phase locked loop of claim 13, wherein the transfer function is a ramp.

15. An improved phase locked loop having a phase detector coupled to a reference clock signal and a feedback signal, a voltage controlled oscillator coupled to the phase detector for generating a synchronized output signal, and a feedback counter coupled to the synchronized output signal for generating the feedback signal, the improvement comprising:

a slew controlled frame aligner for controlling the phase deviation of the feedback signal in response to a sensed phase deviation between the synchronized output signal and a distributed frame signal, wherein the slew controlled frame aligner includes a digital controller coupled to the feedback counter for adding or subtracting phase to the feedback signal over a set period of time;

wherein the digital controller controls the phase deviation of the feedback signal according to a transfer function.

16. The improved phase locked loop of claim 15, wherein the transfer function is a ramp.

17. An improved phase locked loop having a phase detector coupled to a reference clock signal and a feedback signal, a voltage controlled oscillator coupled to the phase detector for generating a synchronized output signal, and a feedback counter coupled to the synchronized output signal for generating the feedback signal, the improvement comprising:

a slew controlled frame aligner for controlling the phase deviation of the feedback signal in response to a sensed phase deviation between the synchronized output signal and a distributed frame signal, wherein the slew controlled frame aligner includes a digital controller coupled to the feedback counter for adding or subtracting phase to the feedback signal over a set period of time;

wherein the digital controller includes two output control lines that are coupled to the feedback counter, an add control line and a subtract control line, and wherein the digital controller outputs a plurality of add and subtract digital pulse signals on the add and subtract control lines in order to control the equivalent analog phase deviation in the feedback signal.

\* \* \* \* \*